US009293571B2

(12) United States Patent
Han et al.

(10) Patent No.: US 9,293,571 B2
(45) Date of Patent: Mar. 22, 2016

(54) METAL NANOPARTICLE MONOLAYER

(71) Applicant: City University of Hong Kong, Hong Kong (CN)

(72) Inventors: Su-Ting Han, Hong Kong (CN); Ye Zhou, Hong Kong (CN); A. L. Roy Vellaisamy, Hong Kong (CN)

(73) Assignee: CITY UNIVERSITY OF HONG KONG, Hong Kong (CN)

(*) Notice: Subject to any disclaimer, the term of this patent is extended or adjusted under 35 U.S.C. 154(b) by 32 days.

(21) Appl. No.: 13/709,458

(22) Filed: Dec. 10, 2012

(65) Prior Publication Data

US 2014/0042494 A1 Feb. 13, 2014

Related U.S. Application Data

(60) Provisional application No. 61/681,535, filed on Aug. 9, 2012.

(51) Int. Cl.

| | |
|---|---|
| ***H01L 29/66*** | (2006.01) |
| ***H01L 29/78*** | (2006.01) |
| ***H01L 21/28*** | (2006.01) |
| ***H01L 29/423*** | (2006.01) |
| *B82Y 99/00* | (2011.01) |

(52) U.S. Cl.

CPC .......... *H01L 29/78* (2013.01); *H01L 21/28273* (2013.01); *H01L 29/42332* (2013.01); *B82Y 99/00* (2013.01); *Y10T 428/25* (2015.01); *Y10T 428/256* (2015.01)

(58) Field of Classification Search

CPC .. B82Y 10/00; B82Y 40/00; H01L 29/42332; H01L 21/28273; H01L 21/28282; H01L 29/42348; H01L 29/792; H01L 29/1606; H01L 29/66833; H01L 21/208; H01L 27/11529; H01L 27/11551; H01L 29/66825

See application file for complete search history.

(56) References Cited

U.S. PATENT DOCUMENTS

| | | | | |
|---|---|---|---|---|
| 5,472,892 | A | 12/1995 | Gwen et al. | |
| 5,801,401 | A | 9/1998 | Forbes | |
| 7,160,525 | B1 * | 1/2007 | Peng et al. | 423/1 |
| 7,790,560 | B2 | 9/2010 | Das | |
| 2005/0072989 | A1 * | 4/2005 | Bawendi et al. | 257/200 |
| 2006/0254503 | A1 * | 11/2006 | Dai et al. | 117/84 |
| 2009/0155967 | A1 * | 6/2009 | Purayath et al. | 438/261 |
| 2012/0080656 | A1 * | 4/2012 | Choi et al. | 257/2 |

OTHER PUBLICATIONS

Hou, T., Lee, C., Narayanan, V., Ganguly, U., and Kan, E. Design Optimization of Metal Nanocrystal Memory—Part I: Nanocrystal Array Engineering. Dec. 2006. I EEE Transactions on Electron Devices. vol. 53, No. 12.*

(Continued)

*Primary Examiner* — Amar Movva
*Assistant Examiner* — Cory Eskridge
(74) *Attorney, Agent, or Firm* — Amin, Turocy & Watson, LLP

(57) ABSTRACT

This disclosure generally relates to a device with a monolayer of metal nanoparticles and a method for making the same. The nanoparticles of the monolayer of metal nanoparticles are grouped in an ultrahigh density with an average distance between each neighboring metal nanoparticle less than or equal to about 3 nanometers. The monolayer can be self-assembled on a substrate to facilitate controllable voltage shifts within the device.

12 Claims, 18 Drawing Sheets

(56) References Cited

OTHER PUBLICATIONS

Shahrjerdi, D., Garcia-Gutierrez, D., Banerjee, S. Fabrication of Ni Nanocrystal Flash Memories Using a Polymeric Self-Assembly Approach. Sep. 2007. IEEE Electron Device Letters. vol. 28, No. 9.*
Myung, S., Park, J., Lee, H., Kim, K. S. and Hong, S. (2010), Ambipolar Memory Devices Based on Reduced Graphene Oxide and Nanoparticles. Adv. Mater., 22: 2045-2049. doi:10.1002/adma.200903267.*
Zhou, et al., "Controlled Ambipolar Charge Transport Through a Self-Assembled Gold Nanoparticle Monolayer". Copyright 2012 WILEY-VCH Verlag GmbH & Co. KGaA, Weinheim, DOI:10.1002/adma.201104375, 5 pages.
Han, et al., "Nanoparticle size dependent threshold voltage shifts in organic memory transistors". Journal of Materials Chemistry. DOI: 10.1039/c1jm12113h. Copyright The Royal Society of Chemistry 2011, 6 pages.
Li et al., "Processable aqueous dispersions of graphene nanosheets." Nature nanotechnology 3.2 (2008): 101-105.
Tiwari et al. "A silicon nanocrystals based memory." Applied Physics Letters 68 (1996): 1377.
Lee et al. "Nonvolatile nanocrystal charge trap flash memory devices using a micellar route to ordered arrays of cobalt nanocrystals." Applied Physics Letters 91.15 (2007): 153506-153506.
Hong et al. "Graphene flash memory." ACS nano 5.10 (2011): 7812-7817.
Wei et al. "Additive-Driven Assembly of Block Copolymer—Nanoparticle Hybrid Materials for Solution Processable Floating Gate Memory." ACS nano 6.2 (2012): 1188-1194.
Lee, Jang-Sik. "Recent progress in gold nanoparticle-based non-volatile memory devices." Gold Bulletin 43.3 (2010): 189-199.
Tang et al. "Energy-band engineering for improved charge retention in fully self-aligned double floating-gate single-electron memories." Nano letters 11.11 (2011): 4520-4526.
Talapin, et al. "Prospects of colloidal nanocrystals for electronic and optoelectronic applications." Chemical reviews 110.1 (2010): 389.
Wang et al.. "Nonvolatile organic transistor-memory devices using various thicknesses of silver nanoparticle layers." Applied physics letters 97.2 (2010): 023511-023511.
Baeg et al. "Controllable Shifts in Threshold Voltage of Top-Gate Polymer Field-Effect Transistors for Applications in Organic Nano Floating Gate Memory." Advanced Functional Materials 20.2 (2010): 224-230.
Lee et al. "Layer-by-layer assembled charge-trap memory devices with adjustable electronic properties." Nature nanotechnology 2.12 (2007): 790-795.
Kim, et al. "Nonvolatile nano-floating gate memory devices based on pentacene semiconductors and organic tunneling insulator layers." Applied Physics Letters 96.3 (2010): 033302-033302.
Novembre, et al. "Gold nanoparticle-pentacene memory transistors." Applied physics letters 92 (2008): 103314.
Leong et al. "Non-Volatile Organic Memory Applications Enabled by in Situ Synthesis of Gold Nanoparticles in a Self-Assembled Block Copolymer." Advanced Materials 20.12 (2008): 2325-2331.
Leong et al. "Charging dynamics of discrete gold nanoparticle arrays self-assembled within a poly (styrene-<equation> b</equation>-4-vinylpyridine) diblock copolymer template." Applied Physics Letters 93.22 (2008): 222908-222908.
Sirringhaus et al. "High-resolution inkjet printing of all-polymer transistor circuits." Science 290.5499 (2000): 2123-2126.
Park et al., "High-performance organic charge trap flash memory devices based on ink-jet printed 6,13-bis (triisopropylsilylethynyl) pentacene transistors", Applied Physics Letters, 96, 213107 (2010).
Santhanam et al. "Self-assembly of uniform monolayer arrays of nanoparticles." Langmuir 19.19 (2003): 7881-7887.
Faccheti et al. "Gate dielectrics for organic field-effect transistors: new opportunities for organic electronics." Advanced Materials 17.14 (2005): 1705-1725.
Zhou et al. "Low temperature processed bilayer dielectrics for low-voltage flexible saturated load inverters." Applied Physics Letters 98.9 (2011): 092904-092904.
Niinisto et al. "Advanced electronic and optoelectronic materials by Atomic Layer Deposition: An overview with special emphasis on recent progress in processing of high-k dielectrics and other oxide materials." physica status solidi (a) 201.7 (2004): 1443-1452.
Santhanam et al. "Microcontact printing of uniform nanoparticle arrays." Nano Letters 4.1 (2004): 41-44.
Facchetti et al. "Synthesis and characterization of diperfluorooctyl-substituted phenylene-thiophene oligomers as n-type semiconductors. Molecular structure-film microstructure-mobility relationships, organic field-effect transistors, and transistor nonvolatile memory elements." Chemistry of materials 16.23 (2004): 4715-4727.
Zhou et al. "Controlled Ambipolar Charge Transport Through a Self-Assembled Gold Nanoparticle Monolayer." Advanced Materials 24.9 (2012): 1247-1251.
Leong et al. "Micellar poly (styrene-b-4-vinylpyridine)-nanoparticle hybrid system for non-volatile organic transistor memory." Journal of Materials Chemistry 19.39 (2009): 7354-7361.
Lee et al. "Tunable memory characteristics of nanostructured, non-volatile charge trap memory devices based on a binary mixture of metal nanoparticles as a charge trapping layer." Advanced Materials 21.2 (2009): 178-183.
Wen et al. "Ultra-large-area self-assembled monolayers of nanoparticles." ACS nano 5.11 (2011): 8868-8876.
Kim et al. "Flexible organic transistor memory devices." Nano letters 10.8 (2010): 2884-2890.
Leong et al. "Towards printable organic thin film transistor based flash memory devices." Journal of Materials Chemistry 21.14 (2011): 5203-5214.
Lee, et al. "Multilevel Data Storage Memory Devices Based on the Controlled Capacitive Coupling of Trapped Electrons." Advanced Materials 23.18 (2011): 2064-2068.
Han et al. "Nanoparticle size dependent threshold voltage shifts in organic memory transistors." Journal of Materials Chemistry 21.38 (2011): 14575-14580.
Tang et al. "Colloidal-quantum-dot photovoltaics using atomic-ligand passivation." Nature materials 10.10 (2011): 765-771.
Collier et al. "Nanocrystal superlattices." Annual Review of Physical Chemistry 49.1 (1998): 371-404.

* cited by examiner

1202

1204

METAL NANOPARTICLE MONOLAYER

CROSS REFERENCE TO RELATED APPLICATION

This application claims priority to US provisional application No. 61/681,535, entitled: "MICROCONTACT PRINTING OF ULTRAHIGH DENSITY GOLD NANOPARTICLE MONOLAYER FOR FLEXIBLE FLASH MEMORIES," and filed on Aug. 9, 2012, the entirety of which is incorporated herein by reference.

TECHNICAL FIELD

This disclosure generally relates to a monolayer of metal nanoparticles with an ultrahigh density (e.g., average distance between each neighboring metal nanoparticle less than or equal to about 3 nanometers) that can be self-assembled on a substrate, e.g., to facilitate controllable voltage shifts.

BACKGROUND

Next generation nonvolatile memory devices require fast data access and a corresponding high storage density. A flash memory device is an example of a nonvolatile memory device that can potentially meet the features required by a next generation storage device. Flash memory devices have many possible device configurations; however, a field-effect transistor (FET)-based memory device with floating gate architecture is a promising candidate for next-generation nonvolatile memory applications. In addition to fast data access and high density, these FET-based memory devices also exhibit a multi-bit per cell storage capability, a single transformer realization, a non-destructive read out, and a compatibility with the current complementary metal-oxide-semiconductor (CMOS) devices.

Flash memory devices based on field-effect transistors (FETs) with floating gate architectures operate based on the variation of a threshold voltage by trapping/releasing the charge carriers of the semiconductor under an external gate bias. Traditional floating gates are planar. FETs with planar floating gates require a high operating voltage to achieve a wide range of threshold voltage shifts and also suffer from poor charge retention time. However, tuning and adaptability of the threshold voltage is critical to the development of a next generation flash memory device. Therefore, FETs with planar floating gates are ineffective candidates for next generation flash memory devices.

The above-described background is merely intended to provide an overview of contextual information regarding next generation flash memory devices, and is not intended to be exhaustive. Additional context may become apparent upon review of one or more of the various non-limiting embodiments of the following detailed description.

SUMMARY

The following presents a simplified summary of the specification in order to provide a basic understanding of some aspects of the specification. This summary is not an extensive overview of the specification. It is intended to neither identify key or critical elements of the specification nor delineate any scope of particular embodiments of the specification, or any scope of the claims. Its sole purpose is to present some concepts of the specification in a simplified form as a prelude to the more detailed description that is presented later.

In accordance with one or more embodiments and corresponding disclosure, various non-limiting aspects are described in connection with the development of a next-generation flash memory device utilizing a metal nanoparticle monolayer.

In an embodiment, a device is described. The device includes a charge trapping layer comprising a self assembled ultra high density monolayer array of metal nanoparticles with diameters greater than 10 nm where an average distance between each neighboring metal nanoparticle is less than or equal to about 3 nanometers. The device also includes a substrate at least partially coated with the charge trapping layer.

In another embodiment, a method is described. The method includes synthesizing metal nanoparticles with diameters greater than 10 nm in a colloidal solution. The method also includes dipping a substrate in the colloidal solution to facilitate self-assembly of a monolayer of the metal nanoparticles on the substrate so that the monolayer of the metal nanoparticles is printed onto the substrate using a microcontact printing technique.

In a further embodiment, a heterojunction transistor is described. The heterojunction transistor includes a gate dielectric and an active layer. The heterojunction transistor also includes a charge trapping layer comprising a monolayer of metal nanoparticles between the gate dielectric and the active layer.

The following description and the drawings set forth certain illustrative aspects of the specification. These aspects are indicative, however, of but a few of the various ways in which the various embodiments of the specification may be employed. Other aspects of the specification will become apparent from the following detailed description of the specification when considered in conjunction with the drawings.

BRIEF DESCRIPTION OF THE DRAWINGS

Numerous aspects and embodiments are set forth in the following detailed description, taken in conjunction with the accompanying drawings, in which like reference characters refer to like parts throughout, and in which.

DETAILED DESCRIPTION

Figure 1:
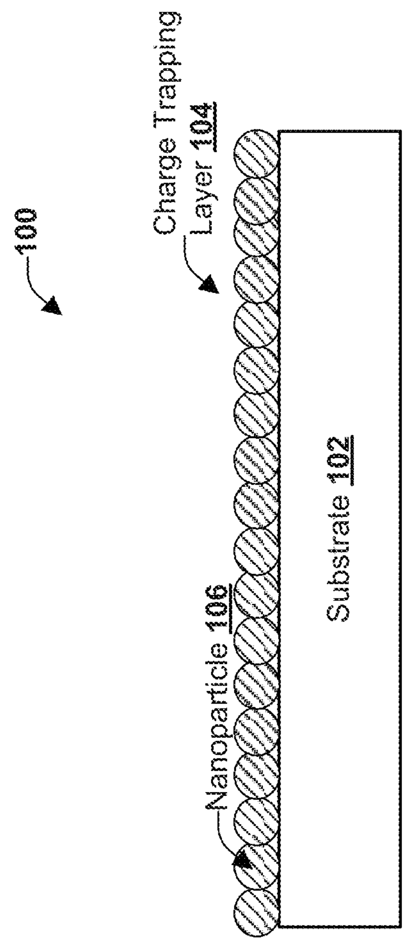
FIG. 1 is an example non-limiting block diagram of a device with a charge trapping layer of metal nanoparticles applied on a substrate, according to an embodiment.

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that the certain aspects of disclosure may be practiced without these specific details, or with other methods, components, molecules, etc. In other instances, well-known structures and devices are shown in block diagram form to facilitate description and illustration of the various embodiments.

In accordance with one or more embodiments described in this disclosure, a device with a monolayer of metal nanoparticles and a method for making the device are described. The nanoparticles of the monolayer of metal nanoparticles are grouped in an ultrahigh density with an average distance between each neighboring metal nanoparticle less than or equal to about 3 nanometers. The monolayer can be self-assembled on a substrate to facilitate controllable voltage shifts within the device.

Referring now to the drawings, with reference initially to FIG. 1, illustrated is an example non-limiting schematic block diagram of a device 100. The device 100 can be, for example, a unipolar transistor. The device 100 includes a substrate 102 and a charge trapping layer 104. The "charge trapping layer" can also be referred to as a "charge storage layer" or the like. The substrate 102 can be any substrate that can be used for semiconductor applications. In an embodiment, the substrate 102 is a flexible material, such as a polymer.

The charge trapping layer 104 at least partially covers and/or coats the substrate 102. In an embodiment, the charge trapping layer 104 covers and/or coats at least about 25% of the substrate 102. In another embodiment, the charge trapping layer 104 covers and/or coats at least about 50% of a surface of the substrate 102. In a further embodiment, the charge trapping layer 104 covers and/or coats at least 75% of a surface of the substrate 102. In the embodiment illustrated in FIG. 1, the charge trapping layer 104 covers and/or coats an entire surface of the substrate 102.

The charge trapping layer 104 is made of metal nanoparticles 106. The metal nanoparticles 106 can be self-assembled in a two-dimensional monolayer on a surface of the substrate 102. The metal nanoparticles 106 in the monolayer can be packed at an ultrahigh density. In other words, the ultrahigh density refers to a density in which the average distance between each neighboring metal nanoparticle 106 is less than or equal to about three nanometers. In an embodiment, the metal nanoparticles 106 can be packed so that the average distance between each metal nanoparticle 106 is less than or equal to about two nanometers. In another embodiment, the metal nanoparticles 106 can be packed so that the average distance between each metal nanoparticle 106 is less than or equal to about 1.5 nanometers.

The metal nanoparticles 106 can each have a diameter greater than about 10 nm. Selecting metal nanoparticles 106 with a diameter greater than about 10 nm ensures that quantum size effects that are pronounced in metal nanoparticles with diameters below about 10 nm are not pronounced. For example, the nanoparticles can be 15 nm diameter, 20 nm, 25 nm, or greater.

The metal nanoparticles 106 can be silver nanoparticles, platinum nanoparticles, copper nanoparticles, gold nanoparticles, or combinations thereof. For example, in an embodiment, the metal nanoparticles 106 are core-shell structures. In this example, the core can include a first metal (e.g., silver) and the shell can include a second metal (e.g., gold).

In an embodiment, the metal nanoparticles 106 can include gold nanoparticles. Gold nanoparticles are an appropriate material to use in the charge transport layer 104. Gold nanoparticles exhibit chemical stability and a high work function.

The metal nanoparticles 106 can be coated with a surfactant. In an embodiment, the surfactant can include alkanethiol with an aliphatic chain. It will be understood that other type of surfactant can be used and that a surfactant including alkanethiol with an aliphatic chain is merely used as an illustrative example.

Figure 2:
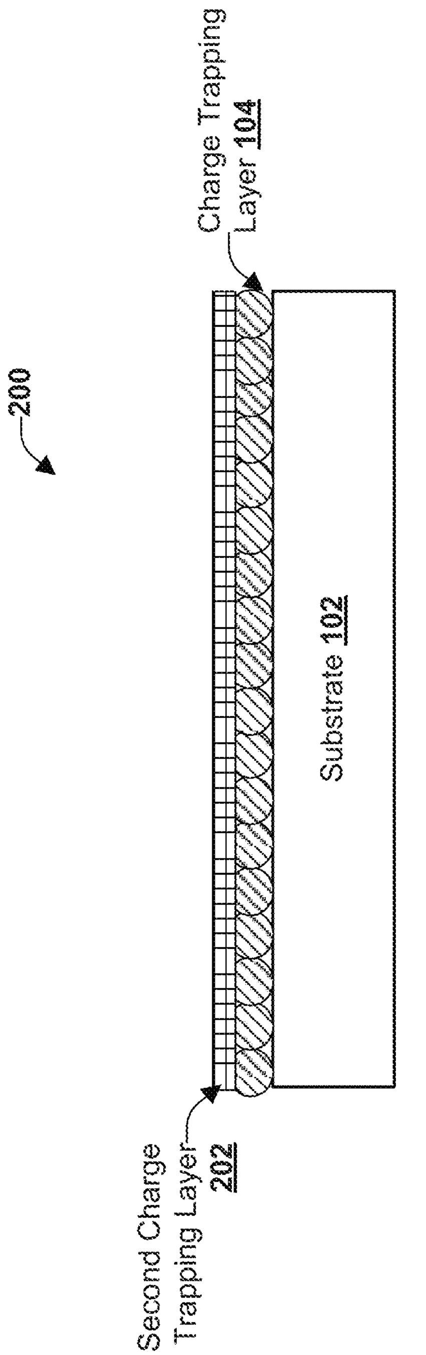
FIG. 2 is an example non-limiting block diagram of a device with a second charge trapping layer of reduced graphene oxide covering the first charge trapping layer of metal nanoparticles applied on a substrate, according to an embodiment.

The charge trapping layer can include two layers, as shown in FIG. 2. FIG. 2 is an example non-limiting block diagram of a device 200 with a second charge trapping layer 202 covering the first charge trapping layer 104. The first charge trapping layer 104 includes the monolayer of metal nanoparticles applied on a substrate. The second charge trapping layer 202 can include a two-dimensional sheet of a material different than the metal nanoparticles. For example, the material of the second charge trapping layer 202 can be reduced graphene oxide. In an embodiment, the reduced graphene oxide can have a smaller work function than the metal utilized in the metal nanoparticles, creating a Fermi level offset between the first charge trapping layer 104 and the second charge trapping layer 202.

The second charge trapping layer 202 can cover at least a part the first charge trapping layer 104. In an embodiment, the second charge trapping layer 202 covers at least 25% of the first charge trapping layer 104. In another embodiment, the second charge trapping layer 202 covers at least 50% of the first charge trapping layer 104. In a further embodiment, the second charge trapping layer 202 covers at least 75% of the first charge trapping layer 104. In yet another embodiment, the second charge trapping layer 202 covers about all of the first charge trapping layer 104, as shown in FIG. 2. However, it will be understood that the first charge trapping layer 104 and the second charge trapping layer 202 can be arranged in different configurations and that the specific configuration is illustrated merely for ease of explanation and illustration.

Figure 3:
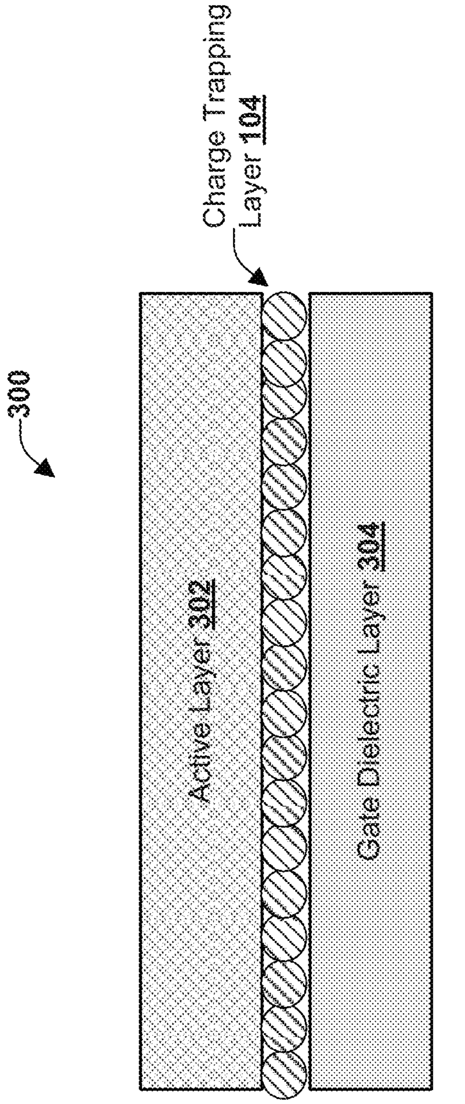
FIG. 3 is an example non-limiting block diagram of a device with a charge trapping layer of metal nanoparticles applied between an active layer and a gate dielectric layer, according to an embodiment.

The charge trapping layer 104 with a monolayer of metal nanoparticles can also be utilized in ambipolar or heterojunction transistors. FIG. 3 is an example non-limiting block diagram of a device 300 (e.g., an ambipolar or heterojunction transistor). The device 300 includes a charge trapping layer 104 of metal nanoparticles applied between an active layer 302 and a gate dielectric layer 304. For example the metal nanoparticles can be self-assembled in a two-dimensional monolayer that coats and/or covers the gate dielectric layer 304. The charge trapping layer 104 can facilitate control over a gate bias and can enable an adjustment of an electron current and/or a hole current to overcome an intrinsic material limitation.

The charge trapping layer 104 at least partially covers and/or coats the gate dielectric layer 304. In an embodiment, the charge trapping layer 104 covers and/or coats at least about 25% of the gate dielectric layer 304. In another embodiment, the charge trapping layer 104 covers and/or coats at least about 50% of a surface of the gate dielectric layer 304. In a further embodiment, the charge trapping layer 104 covers and/or coats at least 75% of a surface of the gate dielectric layer 304. In the embodiment illustrated in FIG. 3, the charge trapping layer 104 covers and/or coats an entire surface of the gate dielectric layer 304.

Similar to the charge trapping layer 104 described in FIG. 1, the charge trapping layer 104 is made of metal nanoparticles, each having a diameter greater than about 10 nm, which avoids pronounced quantum size effects. The metal nanoparticles can be self-assembled in a two-dimensional monolayer on a surface of the gate dielectric layer 304. The metal nanoparticles in the monolayer can be packed at an ultrahigh density (a density in which the average distance between each neighboring metal nanoparticle is less than or equal to about three nanometers). In an embodiment, the metal nanoparticles can be packed so that the average distance between each metal nanoparticle is less than or equal to about two nanometers. In another embodiment, the metal nanoparticles can be packed so that the average distance between each metal nanoparticle is less than or equal to about 1.5 nanometers.

The metal nanoparticles can be made of one or more of silver, platinum, copper, gold, or combinations thereof. For example, in an embodiment, the metal nanoparticles are core-shell structures. In this example, the core can include a first metal (e.g., silver) and the shell can include a second metal (e.g., gold). The metal nanoparticles can be coated with a surfactant. In an embodiment, the surfactant can include alkanethiol with an aliphatic chain. It will be understood that other type of surfactant can be used and that a surfactant including alkanethiol with an aliphatic chain is merely used as an illustrative example.

Figure 4:
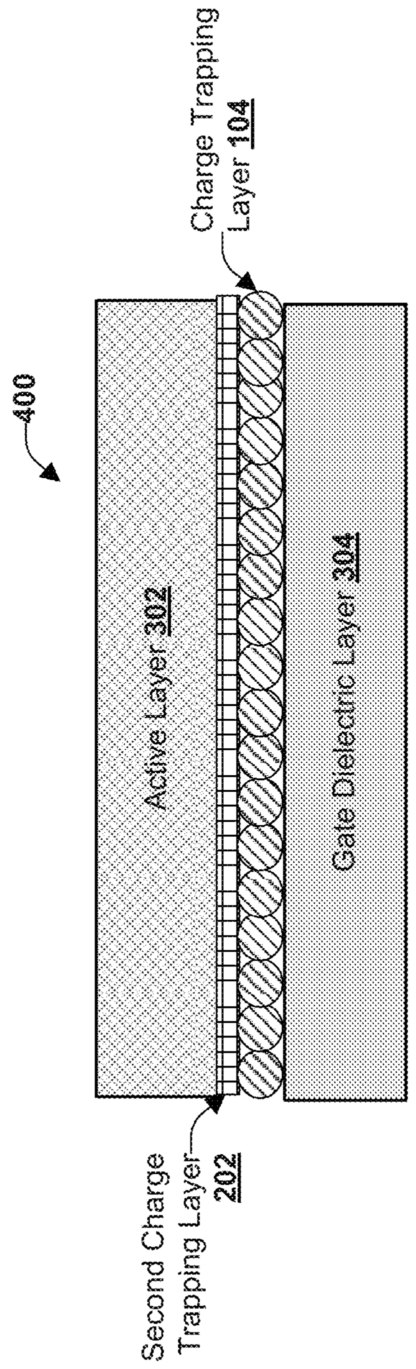
FIG. 4 is an example non-limiting block diagram of a device with a second charge trapping layer of reduced graphene oxide covering the first charge trapping layer of metal nanoparticles applied between an active layer and a gate dielectric layer, according to an embodiment.

Similar to the embodiment as shown in FIG. 2, the charge trapping layer of ambipolar or heterojunction transistors can include two layers, as shown in FIG. 4. FIG. 4 is an example non-limiting block diagram of a device 400 with a second charge trapping layer 202 covering the first charge trapping layer 104. The charge trapping layer 104 can coat and/or cover at least part of the gate dielectric layer 304. The second charge trapping layer 202 can cover at least part of the first charge trapping layer 104. The active layer 302 can cover at least part of the second trapping layer.

The second charge trapping layer 202 can include a two-dimensional sheet of a material different than the metal nanoparticles. For example, the material of the second charge trapping layer 202 can be reduced graphene oxide. In an embodiment, the reduced graphene oxide can have a smaller work function than the metal utilized in the metal nanoparticles, creating a Fermi level offset between the first charge trapping layer 104 and the second charge trapping layer 202.

The second charge trapping layer 202 can cover at least a part the first charge trapping layer 104. In an embodiment, the second charge trapping layer 202 covers at least 25% of the first charge trapping layer 104. In an embodiment, the second charge trapping layer 202 covers at least 50% of the first charge trapping layer 104. In another embodiment, the second charge trapping layer 202 covers at least 75% of the first charge trapping layer 104. In a further embodiment, the second charge trapping layer 202 covers about all of the first charge trapping layer 104, as shown in FIG. 4.

The active layer 302 can cover at least a part the second charge trapping layer 202. In an embodiment, the active layer 302 covers at least 25% of the second charge trapping layer 202. In another embodiment, the active layer 302 covers at least 50% of the second charge trapping layer 202. In yet another embodiment, the active layer 302 covers at least 75% of the second charge trapping layer 202. In a further embodiment, the active layer 302 covers about all of the second charge trapping layer 202, as shown in FIG. 4. However, it will be understood that the first charge trapping layer 104 and the second charge trapping layer 202 can be arranged in different configurations and that the specific configuration is illustrated merely for ease of explanation and illustration.

Figure 5:
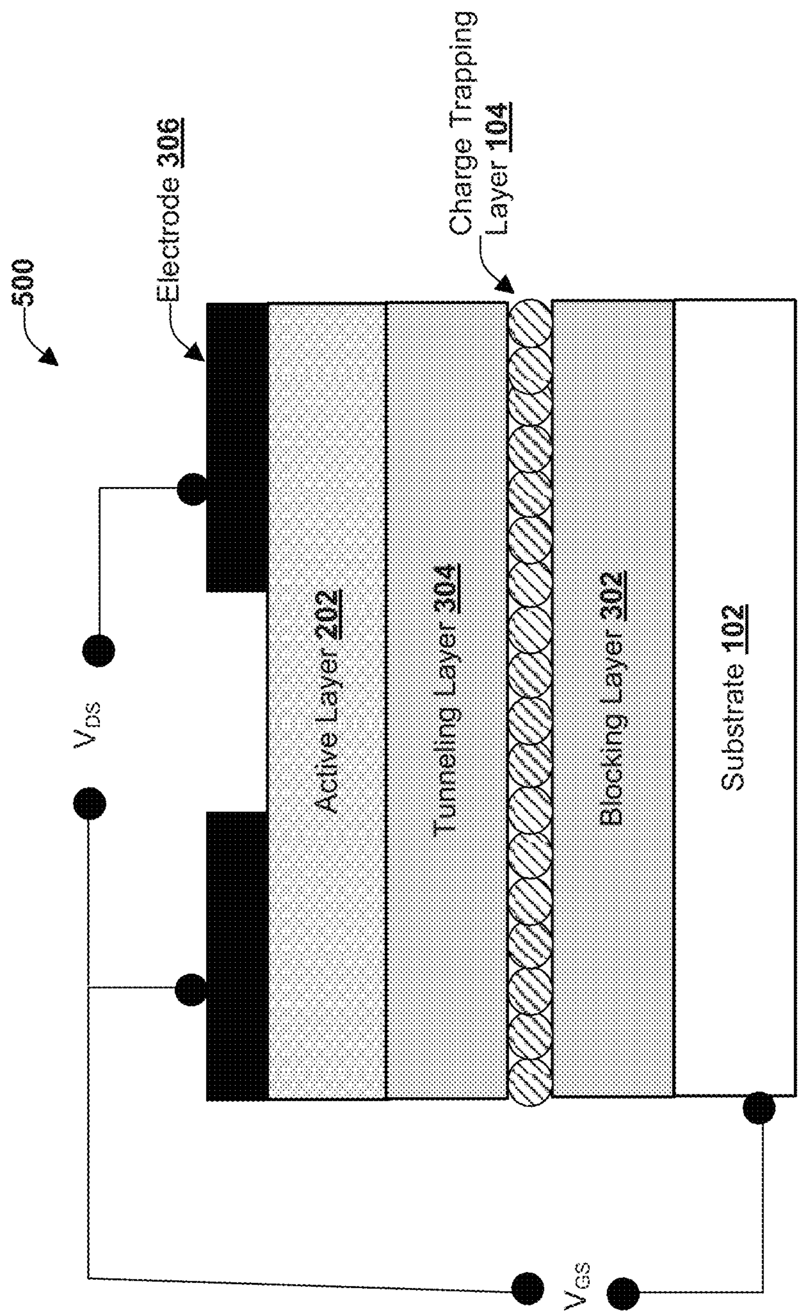
FIG. 5 is an example non-limiting block diagram of a heterojunction transistor with a charge trapping layer of metal nanoparticles applied between a blocking layer and a tunneling layer of the gate dielectric, according to an embodiment.

Referring now to FIG. 5, illustrated is an example non-limiting block diagram of a heterojunction transistor 500 that can be utilized in a memory device architecture, such as a flash memory device. The heterojunction transistor 500 includes a charge trapping layer 104 of metal nanoparticles applied between a blocking layer 302 and a tunneling layer 304 of the gate dielectric. For example, the blocking layer 302 can be about 200 nm within the gate dielectric and the tunneling layer 304 can be about 10 nm within the gate dielectric. In an embodiment, the gate dielectric can include a metal oxide that is dense so that it can facilitate a low leakage current to provide reliable performance of the heterojunction transistor 500 (e.g., $Al_2O_3$, which is a suitable dielectric layer on various substrates). The gate dielectric can be formed, for example, according to an atomic layer deposition method. Atomic layer deposition can facilitate growth of pinhole-free dielectric layers with controlled thickness and large area uniformity at low temperature. The heterojunction transistor 500 also includes a substrate 102 (e.g., a flexible polymeric substrate, although any type of substrate would work in this situation), an active layer 202 and top electrodes 306.

The charge trapping layer 104 of heterojunction transistor 500 can be made of a monolayer of metal nanoparticles applied between layers of the gate dielectric, the blocking layer 302 and the tunneling layer 304. The monolayer, in an embodiment, can be a self-assembled monolayer of metal nanoparticles closely packed at an ultrahigh density. Ultrahigh density, in other words, is a density in which the average distance between each neighboring metal nanoparticle is less than or equal to about three nanometers. In an embodiment, the metal nanoparticles can be packed so that the average distance between each metal nanoparticle is less than or equal to about two nanometers. In another embodiment, the metal nanoparticles can be packed so that the average distance between each metal nanoparticle is less than or equal to about 1.5 nanometers. Additionally, the metal nanoparticles can each have a diameter greater than about 10 nm, to avoid pronounced quantum size effects.

By embedding a monolayer of closely packed metal nanoparticles at the interface between the blocking layer 302 and the tunneling layer 304 (e.g., at an interface between the blocking layer 302 and the tunneling layer 304), multilevel data storage can be controlled by an external gate bias. The monolayer of closely packed metal nanoparticles at the interface between the blocking layer 302 and the tunneling layer 304 allows for a large memory window (e.g., about 15 V or more) and a long retention time (e.g., $10^4$ seconds or more), which can be achieved due at least in part to the large density of storage sites and low lateral charge leakage. The large memory window and long retention time enable heterojunction transistor 500 to be a candidate for potential applications in flash memory device scaling. Heterojunction transistor 500 also exhibits a good endurance property (greater than or equal to about 1,000 cycles) and a good mechanical stability (greater than or equal to about 500 bending cycles).

In an example application of the heterojunction transistor 500, after the metal nanoparticle monolayer is inserted between the blocking layer 302 and the tunneling layer 304 of the gate dielectric as charge storage layer 104, the charge carriers can either be stored in the floating gate (metal nanoparticle monolayer) by a programming operation or move back to the semiconductor layers by an erasing operation. Three factors of the metal nanoparticle monolayer can facilitate expecting wide range of threshold shifts (tunable memory properties): size of the metal nanoparticles, density of the metal nanoparticles and surface modification of the metal nanoparticles. By manipulating the work function (size) and dimensions (density) of the metal nanoparticles, the trap level and trap site, which directly influence threshold voltage shifts, can be effectively controlled in heterojunction transistor 500.

The material utilized for the metal nanoparticles can also affect the work function along with various surface modifications. The metal nanoparticles can be made of one or more of silver, platinum, copper, gold, or combinations thereof. For example, in an embodiment, the metal nanoparticles 106 are core-shell structures. In this example, the core can include a first metal (e.g., silver) and the shell can include a second metal (e.g., gold). The metal nanoparticles can be coated with a surfactant. In an embodiment, the surfactant can include alkanethiol with an aliphatic chain. It will be understood that other type of surfactant can be used and that a surfactant including alkanethiol with an aliphatic chain is merely used as an illustrative example.

Figure 6:
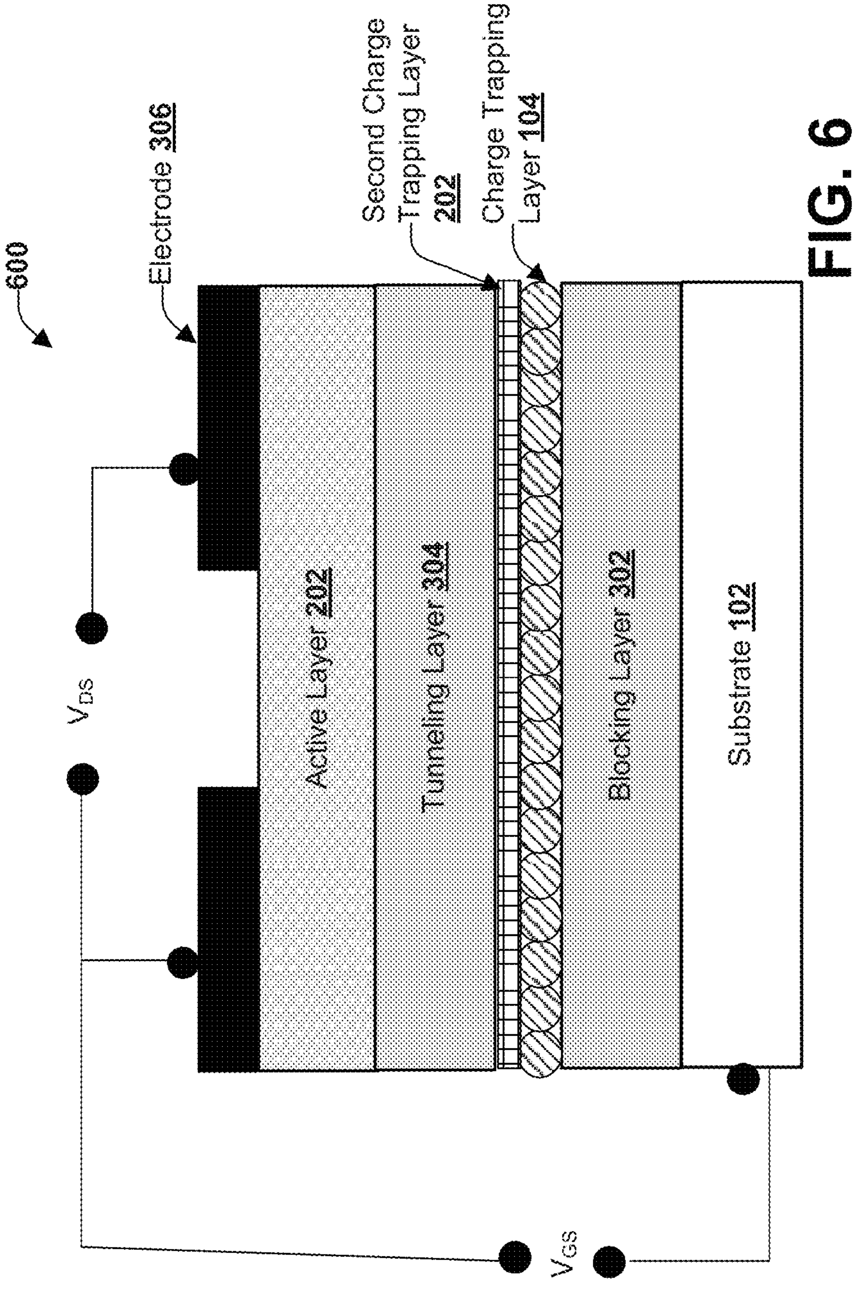
FIG. 6 is an example non-limiting block diagram of a heterojunction transistor with a second charge trapping layer of reduced graphene oxide covering the first charge trapping layer of metal nanoparticles applied between a blocking layer and a tunneling layer of the gate dielectric, according to an embodiment.

The charge trapping layer of a heterojunction transistor 600 can also be made of two layers: charge trapping layer 104 and second charge trapping layer 202, for example. FIG. 6 is an example non-limiting block diagram of a heterojunction transistor 600 with a second charge trapping layer 202 of covering the first charge trapping layer 104 applied between a blocking layer 302 and a tunneling layer 304 (e.g., at an interface between the blocking layer 302 and a tunneling layer 304) of the gate dielectric.

The first charge trapping layer 104 includes the monolayer of metal nanoparticles applied on the blocking layer 302. The second charge trapping layer 202 can include a two-dimensional sheet of a material different than the metal nanoparticles. For example, the material of the second charge trapping layer 202 can be reduced graphene oxide. In an embodiment, the reduced graphene oxide can have a smaller work function than the metal utilized in the metal nanoparticles, creating a Fermi level offset between the first charge trapping layer 104 and the second charge trapping layer 202. The second charge trapping layer 202 can be covered by the tunneling layer 304. However, it will be understood that the first charge trapping layer 104 and the second charge trapping layer 202 can be arranged in different configurations and that the specific configuration is illustrated merely for ease of explanation and illustration.

FIGS. 7-11 illustrate methods and/or flow diagrams in accordance with embodiments of this disclosure. For simplicity of explanation, the methods are depicted and described as a series of acts. However, acts in accordance with this disclosure can occur in various orders and/or concurrently, and with other acts not presented and described in this disclosure. Furthermore, not all illustrated acts may be required to implement the methods in accordance with the disclosed subject matter.

It will be understood that reference to depositing a monolayer of metal particles on a "substrate" can generally refer to depositing the monolayer upon the substrate in FIGS. 1-2, the dielectric of FIGS. 3-4, and within the dielectric of FIGS. 5-6.

Figure 7:
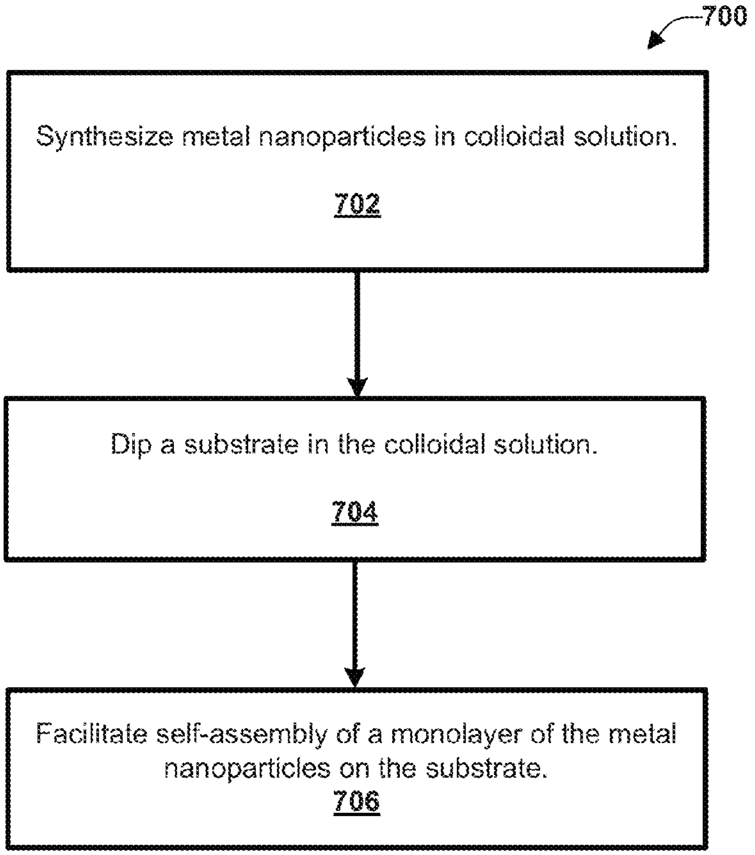
FIG. 7 is an example non-limiting process flow diagram of a method for creating a device with a monolayer of metal nanoparticles on a substrate, according to an embodiment.

Referring now to FIG. 7, illustrated is an example non-limiting process flow diagram of a method 700 for creating a device with a monolayer of metal nanoparticles on a substrate. Method 700 facilitates solution-processed metal nanoparticle synthesis and self-assembly, which can be utilized to fabricate charge trapping layer in both unipolar and ambipolar transistors.

At element 702, metal nanoparticles can be synthesized in a colloidal solution. The metal nanoparticles can be synthesized so that they each have a diameter greater than about 10 nm. Synthesizing the metal nanoparticles with a diameter greater than about 10 nm ensures that quantum size effects that are pronounced in metal nanoparticles with diameters below about 10 nm are not pronounced. For example, the nanoparticles can be 15 nm diameter, 20 nm, 25 nm, or greater. The size of the nanoparticles can be controlled, for example, based on the composition of the colloidal solution, the time for generation, or any other parameter.

The metal nanoparticles can be synthesized and ordered on the surface of the colloidal solution. Ordering of the metal nanoparticles on the liquid surface of the colloidal solution can generate a large-area of closely-packed nanoparticles.

The metal nanoparticles can be silver nanoparticles, platinum nanoparticles, copper nanoparticles, gold nanoparticles, or combinations thereof. For example, in an embodiment, the metal nanoparticles are core-shell structures. In this example, the core can include a first metal (e.g., silver) and the shell can include a second metal (e.g., gold).

The metal nanoparticles can be coated with a surfactant (e.g., the surfactant can be in the colloidal solution with the metal to facilitate coating the metal nanoparticles). In an embodiment, the surfactant can include alkanethiol with an aliphatic chain. It will be understood that other type of surfactant can be used and that a surfactant including alkanethiol with an aliphatic chain is merely used as an illustrative example.

The nanoparticles can be created by several methods, including: thermal evaporation, chemical processes like the electrostatic self-assembly method and synthesis in block co-polymer. However, these methods are not suitable for depositing the metal nanoparticles on a surface at an ultrahigh density. The ultrahigh density refers to a density in which the average distance between each neighboring metal nanoparticle is less than or equal to about three nanometers. In an embodiment, the metal nanoparticles can be packed so that the average distance between each metal nanoparticle is less than or equal to about two nanometers. In another embodiment, the metal nanoparticles can be packed so that the average distance between each metal nanoparticle is less than or equal to about 1.5 nanometers.

For example, the thermal evaporation method is not a suitable method to increase the density of metal nanoparticles, since the size of the metal nanoparticles simply increases via Oswald ripening as film thickness increases. Additionally, the problem of comparatively low density and poor order exist in reported solution-processed methods. On the other hand, the ability to use a microcontact printing process to generate nanoparticle arrays, as illustrated at elements 704 and 706, has the benefits of flexibility, simplified manufacturing and efficient use of materials.

At element 704, a substrate can be dipped in the colloidal solution. At element 706, self-assembly of a monolayer of the metal nanoparticles is facilitated on a surface of the substrate. In other words, a Langmuir film of self-assembled nanoparticles can be lifted from the colloidal surface by the Langmuir-Schaefer deposition method utilizing a flat poly(dimethysiloxane) (PDMS) pad and then transferred intact to desired substrate.

Accordingly, the monolayer of metal nanoparticles is printed onto the surface of the substrate using a micro-contact printing technique. The micro-contact printing technique is a facile fabrication method for obtaining a monolayer of metal nanoparticles on a surface (e.g., of a substrate). The metal nanoparticles in the monolayer are arranged with an ultrahigh density with a uniform size distribution.

Figure 8:
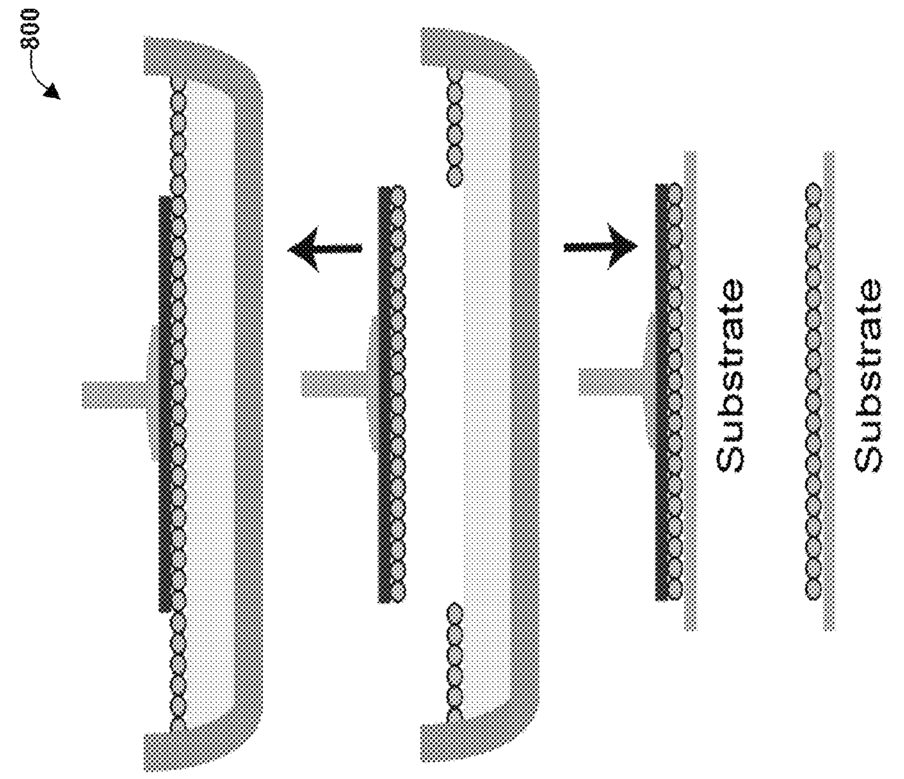
FIG. 8 is an example non-limiting pictorial illustration of the method shown in FIG. 7, according to an embodiment.

Referring now to FIG. 8, illustrated is an example non-limiting pictorial illustration 800 of the method 700 shown in FIG. 7. The monolayer of metal nanoparticles can be created by lifting a Langmuir film of self-assembled metal nanoparticles from the colloidal surface (which develops, for example, after solvent evaporation) by the Langmuir-Schaefer deposition method utilizing a flat poly(dimethysiloxane) (PDMS) pad and then transferred intact to desired substrate.

As an example, the metal nanoparticles can be synthesized in a toluene/hexane (1:1) mixed solvent. The metal nanoparticles are, in this example, alkanethiol-protected gold nanoparticles. After evaporation of the solvent, a 2D self-assembled gold nanoparticle monolayer can be first lifted from a deionized water surface (e.g., a concave surface of the deionized water) using a PDMS pad by a Langmuir-Schaefer deposition method and then the PDMS pad can be brought into conformal contact with the substrate for a time sufficient to facilitate deposition of the metal nanoparticles on the surface of the substrate (e.g., for about 10 s). Fabrication of the well-ordered nanoparticle array (or monolayer) is easy to transfer intact to both hydrophobic and hydrophilic substrates. Applications of devices with the uniform monolayer of ultra-high density alkanethiol-protected metal nanoparticles can be utilized, for example, as a microcontact printed charging trapping layer for the application in flash memory. A wide range of reliable, reversible threshold voltage shifts can be achieved using different kinds of self-assembled metal nanoparticle monolayers through manipulating the size, density, surface modification (e.g., surfactant), and the like of the metal nanoparticles.

Figure 9:
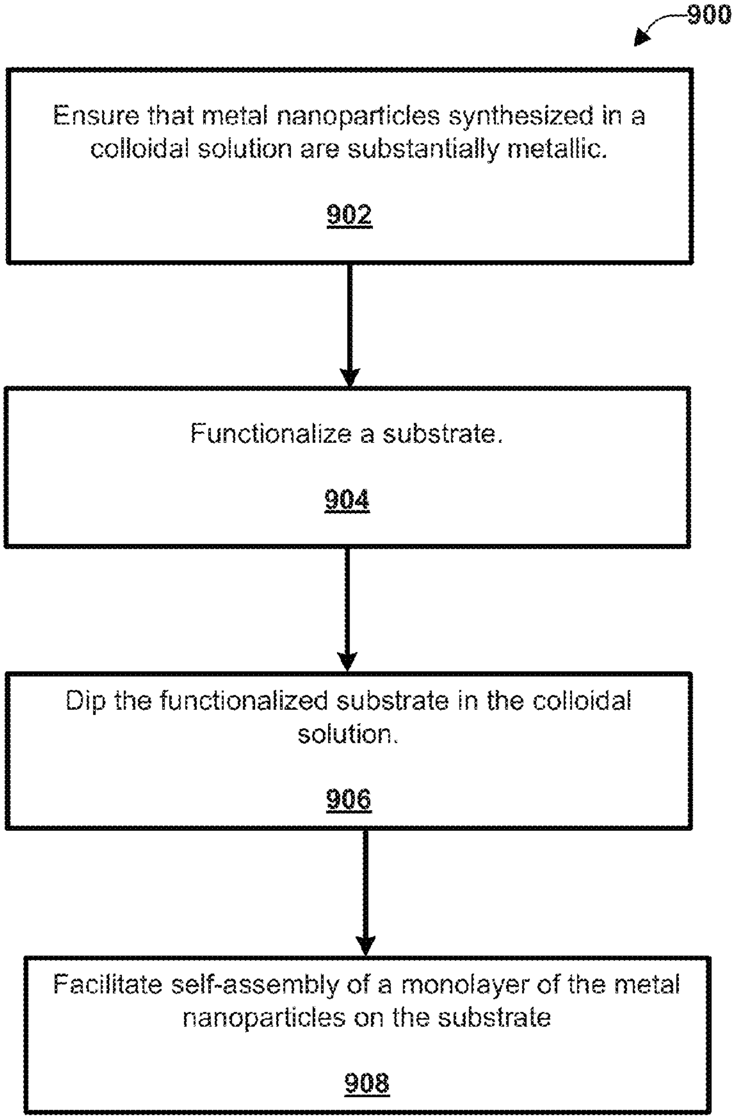
FIG. 9 is an example non-limiting process flow diagram of a method for creating a device with a monolayer of metal nanoparticles on a functionalized substrate, according to an embodiment.

Referring now to FIG. 9, illustrated is an example non-limiting process flow diagram of a method 900 for creating a device with a monolayer of metal nanoparticles on a functionalized substrate, according to an embodiment. The method 900 can be used in connection with methods 700 or 800.

At element 902, it is ensured that the metal nanoparticles synthesized in the colloidal solution are substantially metallic. In other words, the metal nanoparticles do not include metal oxide (beyond trace amounts). In an embodiment, the metal nanoparticles include no instances of metal oxide. The metal nanoparticles can be assured not to include metal oxide by a citrate reduction method. At element 904, the substrate can be functionalized before the self-assembly of the monolayer to facilitate the self assembly.

The array of nanoparticles at the ultrahigh density can be formed on a surface (e.g., concave surface) of deionized water after evaporation of the solvent in the colloidal solution. At element 906, the functionalized substrate can be dipped in the colloidal solution and/or a press can be dipped into the colloidal solution and pressed against the substrate. At element 908, the self-assembly of the monolayer of the metal nanoparticles on the surface of the substrate can be facilitated (e.g., by pressing a coated press onto the substrate).

Figure 10:
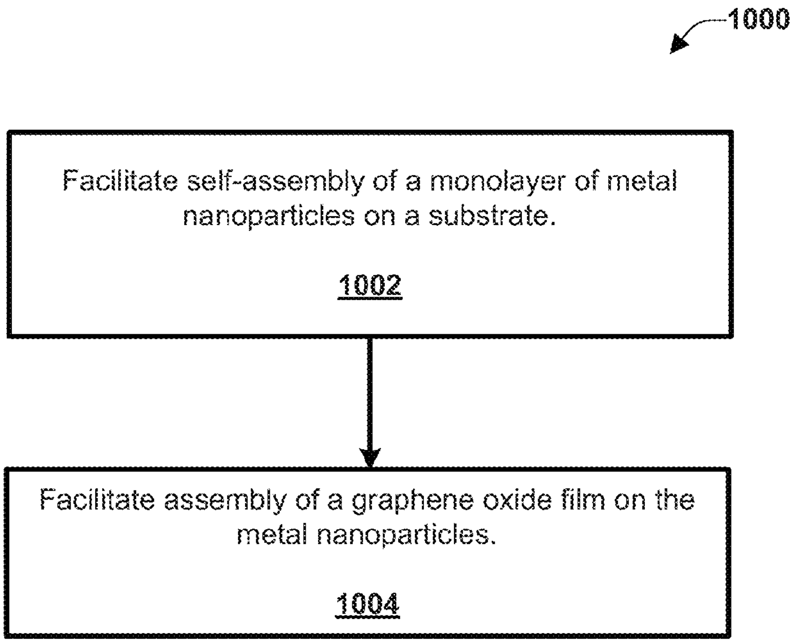
FIG. 10 is an example non-limiting process flow diagram of a method for creating a device with a reduced graphene oxide layer covering a monolayer of metal nanoparticles, according to an embodiment.

Referring now to FIG. 10 is an example non-limiting process flow diagram of a method 1000 for creating a device with two charge trapping layers is described. At element 1002, the self-assembly of a monolayer of metal nanoparticles on the surface of a substrate is facilitated (e.g., in accordance with any method 700-900). At 1004, assembly of the second charge trapping layer is facilitated. The second charge trapping layer can be a film of reduced graphene oxide that covers the metal nanoparticles. In an embodiment, the second charge trapping layer can include reduced graphene oxide. The second charge trapping layer can be fabricated according to a solution processing method conducted at a low temperature.

The two charge trapping layers have applications with regard to floating gate field-effect transistors. Floating gate field-effect transistor memories that are embedded with metal nanoparticles alone at the gate dielectrics are a good replacement for the planar floating gate in traditional devices. The nanoparticles can meet the requirement of fast data access and high density for the next generation flash memories. However, the nanoparticles exhibit a fairly poor charge retention time induced by the thin tunneling dielectric layer, which is a drawback for the nanoparticle floating gate memory device. Simply increasing the thickness of tunneling dielectric layer is insufficient because it can degrade the program/erase speed and increase the power consumption. Alternatively, the two charge trapping layer floating gate structure can achieve better retention properties by preventing the trapped charge carriers leaking back to the channel through increasing the energy barrier arising between the upper and lower floating gates.

If the two charge trapping layers are constructed of the same material, the charge trapping layer can form poor interface with the dielectric layer, which can have inverse impact on the overall device performance. Accordingly, the second charge trapping layer is constructed of a different material than the metal nanoparticles. For example, the material of the second charge trapping layer can be made of any material with a suitable work function from which arises an energy barrier sufficient to obtain a long retention time; a large area to achieve an accurate spatial distribution on the lower floating gate; and a substantially flat surface to improve the interface quality between the double floating gate and dielectric layer.

Graphene can be used as the second charge trapping layer due to its unique properties, including, but not limited to, high three-dimensional aspect ratio, large specific surface area, highly electrical conductivity, excellent mechanical stiffness and flexibility. Chemically reduced graphene oxide still exhibits these properties, even though the slight degradation of its electrical properties induced by inevitably contains lattice defects.

The second charge trapping layer (e.g., reduced graphene oxide sheets) can be assembled covering the charge trapping layer of metal nanoparticles according to a solution-processed layer-by-layer method. The charge trapping layer can be formed on a substrate, such as a flexible polyethylene terephthalate (PET) substrate. Specifically, the monolayer of reduced graphene oxide sheets and metal nanoparticle monolayer act as the upper and lower floating gate, respectively. The self-assembled large area reduced graphene oxide sheet can almost fully cover metal nanoparticle monolayer.

Compared to a single charge trapping layer with the metal nanoparticle monolayer, the mobility (μ), on/off ratio ($I_{on/off}$) and sub-threshold swing (S), memory window and retention time are significantly improved when the second charge trapping layer is added. When the second trapping layer is reduced graphene oxide, which has a smaller work function than that of the metal nanoparticles, a Fermi level offset is created between the hybrid double floating gates. Therefore a high energy barrier between the metal nanoparticle monolayer charge trapping layer and the semiconductor channel of the memory device, making it harder for trapped charge carriers to leak out from the lower floating gate, thereby increasing the retention time.

Figure 11:
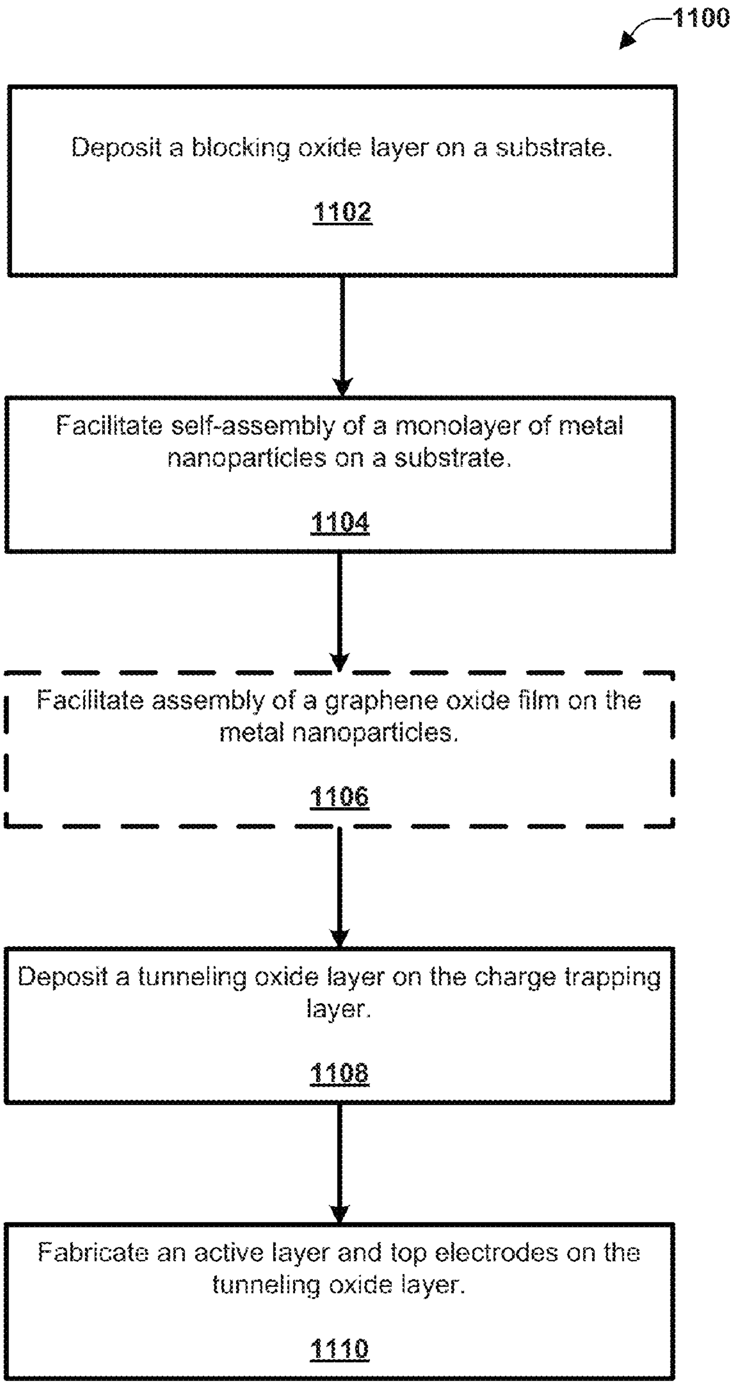
FIG. 11 is an example non-limiting process flow diagram of a method for fabricating a heterojunction transistor, according to an embodiment.

Referring now to FIG. 11, illustrated is an example non-limiting process flow diagram of a method 1100 for fabricating a heterojunction transistor, according to an embodiment. At 1102, a blocking oxide layer can be deposited on a substrate. At 1104, self-assembly of a monolayer of metal nanoparticles is facilitated. The monolayer of metal nanoparticles can form a charge trapping layer. Optionally, at 1106, assembly of a second charge trapping layer can be facilitated. The second charge trapping layer can be a graphene oxide film (e.g., a reduced graphene oxide film). Additionally, the second charge trapping layer can be formed to cover the monolayer of metal nanoparticles. At 1108, a blocking oxide layer can be formed on the charge trapping layer. At 1110, an active layer and top electrodes can be formed on the blocking oxide layer.

To give context regarding the metal nanoparticle array to be used as the charge trapping layer, experiments were conducted utilizing gold nanoparticles. Gold is just one example of the many types of metal that can be utilized to facilitate generation of a monolayer of metal nanoparticles on a substrate.

Figure 12:
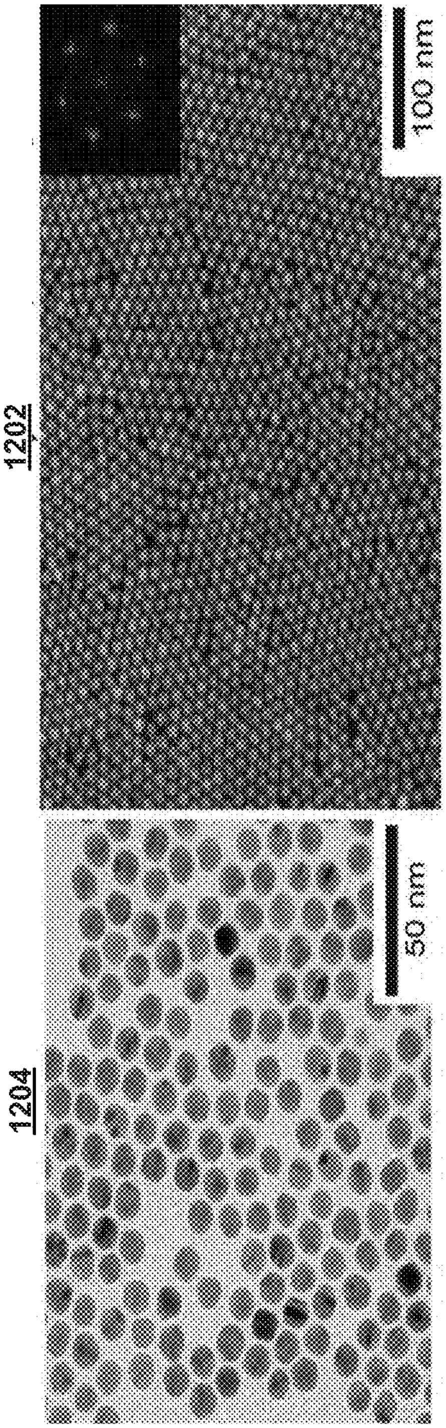
FIG. 12 shows example non-limiting images of a substrate coated with a metal nanoparticle monolayer, according to an embodiment.

FIG. 12 shows example non-limiting images of a substrate coated with a metal nanoparticle monolayer fabricated through a conformal printing process, according to an embodiment. At element 1202, a field emission scanning electron microscope image of a superlattice of the gold nanoparticles is shown with image area ~400×600 $nm^2$. The nanoparticles are closely packed and of high quality.

The density of the gold nanoparticle monolayer is estimated to be about $4.9\times10^{11}$ $cm^{-2}$. Ordering of the superlattice is evidenced by diffraction patterns as shown in the inset image. The sharp spot and multiple diffraction orders evidence that the nanoparticles in the ~400×600 $nm^2$ area have the same grain. Any imperfections or defects observed in the 2D superlattice are believed to have a negligible influence on the trapping/detrapping behavior At element 1204, a transmission electron microscope micrograph of gold nanoparticles as synthesized, coated with 1-dodecanethiolate with average diameter of 10 nm. Almost no aggregation can be observed.

Figure 13:
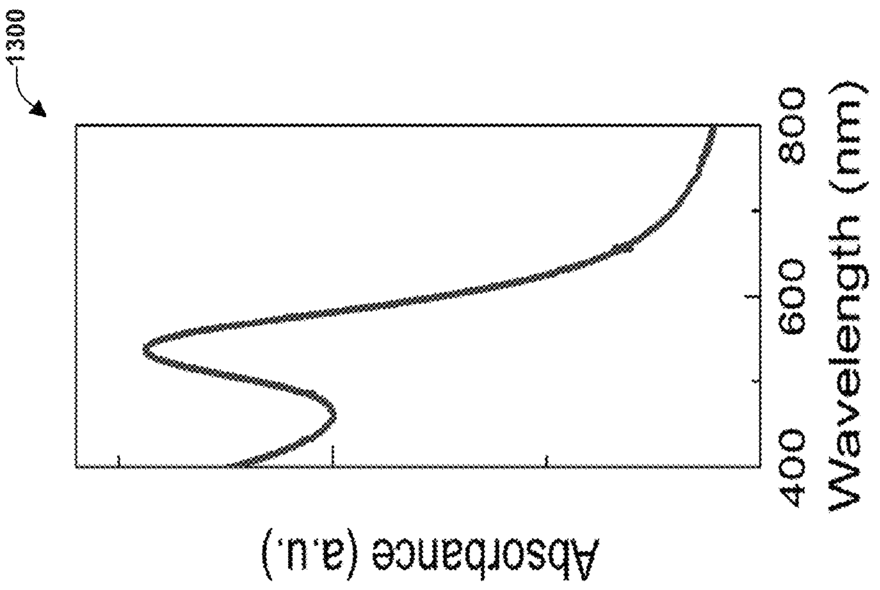
FIG. 13 is an example non-limiting plot of the UV-visible absorption spectra of a gold nanoparticles/toluene solution, according to an embodiment.

Referring now to FIG. 13, illustrated is an example non-limiting plot 1300 of the UV-visible absorption spectra of a gold nanoparticles/toluene solution, according to an embodiment. The absorption spectrum of the gold colloidal solution shows the peak centered at 520 nm.

Figure 14:
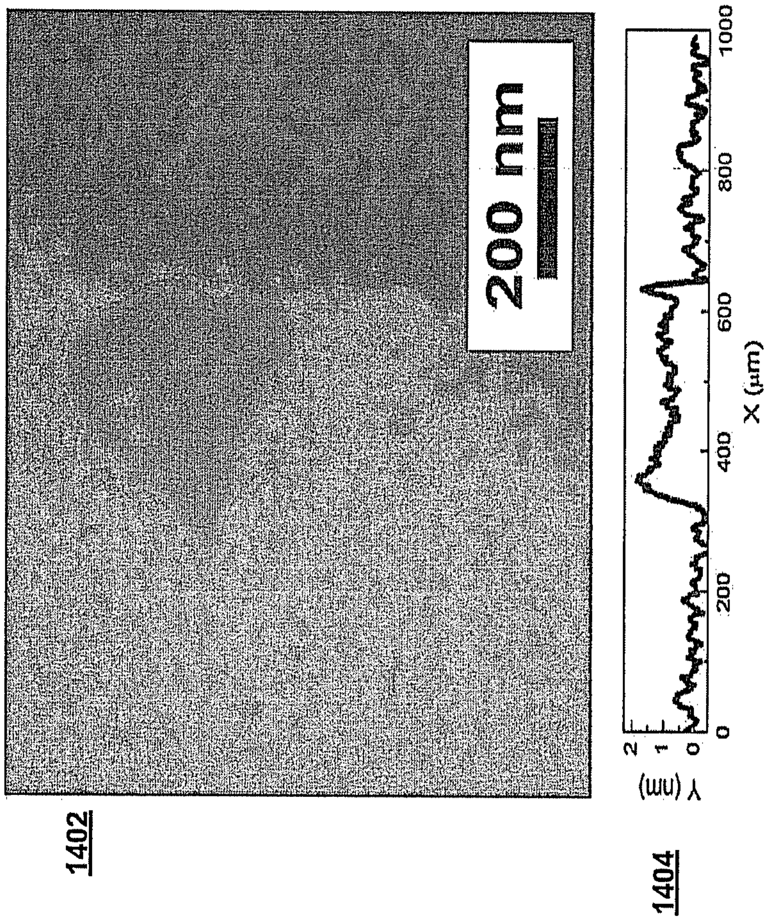
FIG. 14 is an example non-limiting tapping mode AFM image of a reduced graphene oxide sheet with a corresponding height profile, according to an embodiment.

Referring now to FIG. 14, illustrated is an example non-limiting tapping mode atomic force microscope image of a reduced graphene oxide sheet 1402 on a silicon substrate with a corresponding height profile 1404, according to an embodiment. The reduced graphene oxide sheets exhibit an effective thickness of about 1 nm and lateral dimension of about 400-about 500 nm have been obtained.

Figure 15:
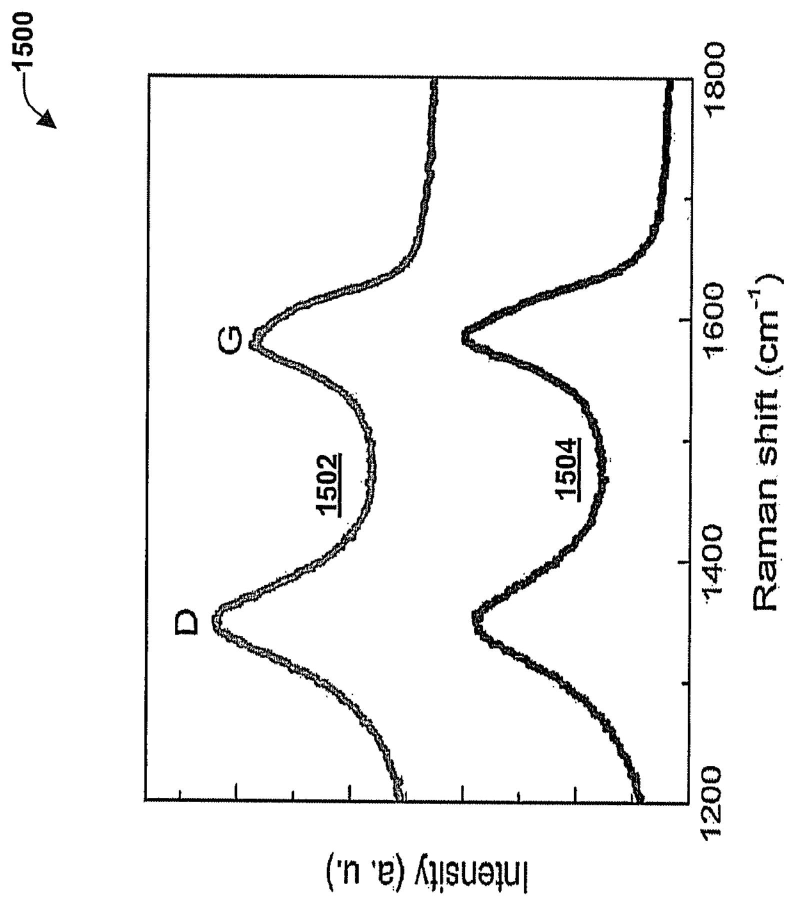
FIG. 15 is an example non-limiting Raman spectra of graphene oxide and reduced graphene oxide, according to an embodiment.

A significant structural change from graphene oxide to reduced graphene oxide after the chemical reduction is reflected in the Raman spectra, as shown in FIG. 15. The typical features in the Raman spectra are the D band at 1352 $cm^{-1}$ and the G band at 1593 $cm^{-1}$. The D band is a breathing mode of k-point phonons of A1g symmetry while the G band is usually attributed to the E2g phonon of C $sp^2$ atoms. The intensity ratio of D band to G band of the graphene oxide 1504 and reduced graphene oxide 1502 increase from 0.94 to 1.2, suggesting a strong increase in the defect density related to the defunctionalized epoxide and hydroxyl groups by the reduction of exfoliated graphene oxide.

Figure 16:
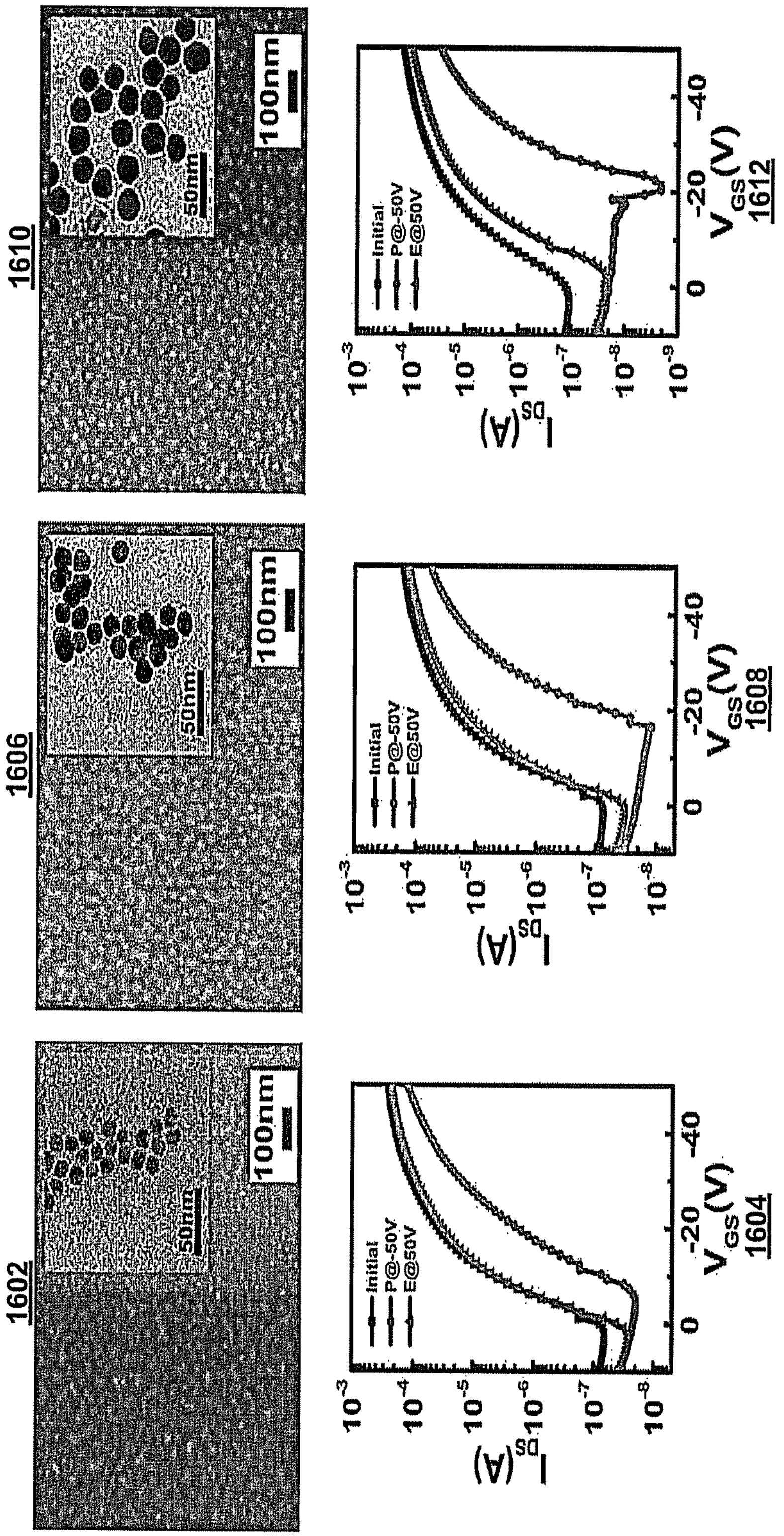
FIG. 16 shows an example non-limiting illustration of tuning the threshold voltage according to different sized metal nanoparticles, according to an embodiment.
Figure 17:
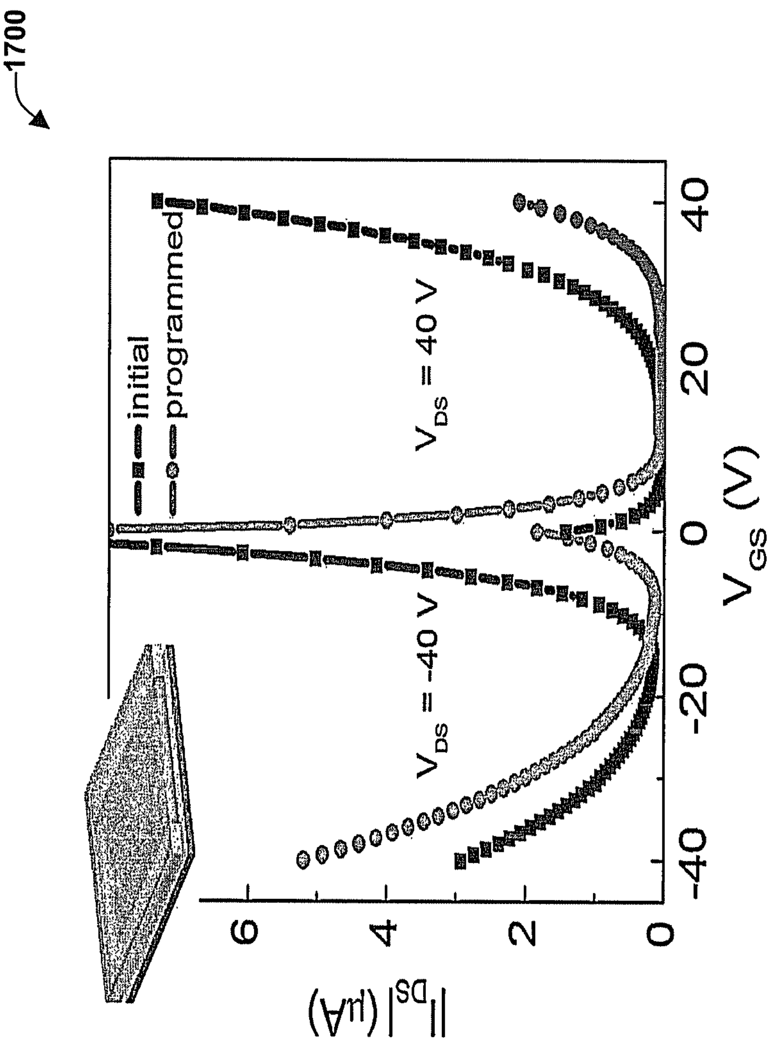
FIG. 17 is an example non-limiting illustration of tuning the electron/hole mobility in an ambipolar transistor by inserting a monolayer of metal nanoparticles, according to an embodiment.
Figure 18:
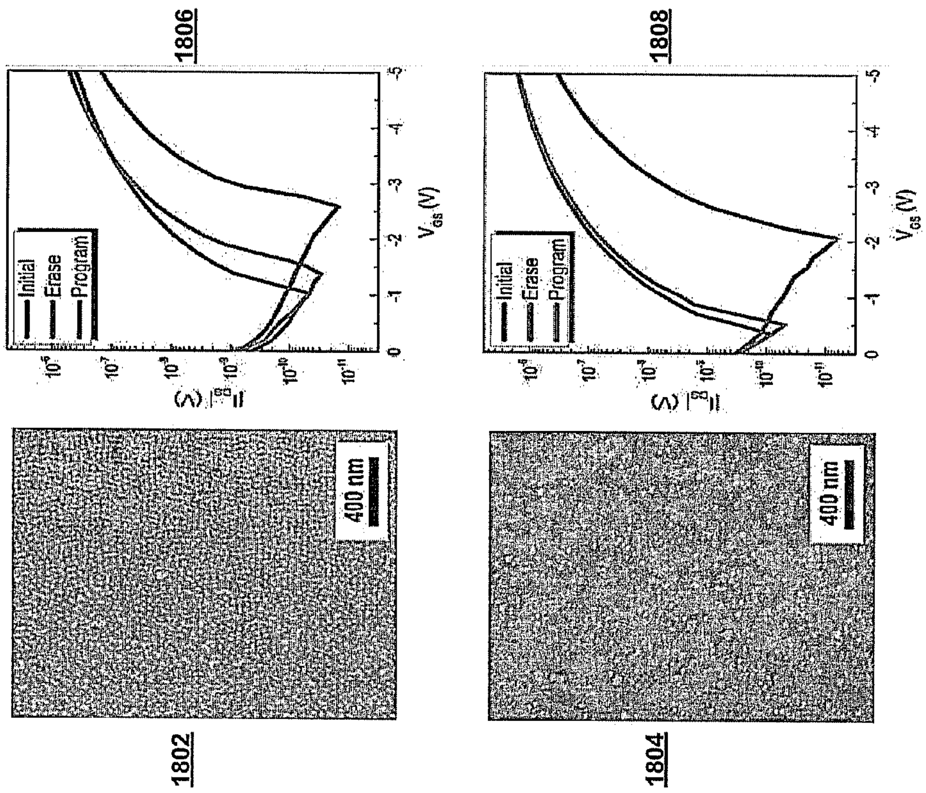
FIG. 18 shows an example non-limiting comparison of transfer characteristics when a reduced graphene oxide layer is included over the metal nanoparticle layer compared to the metal nanoparticle layer alone.

FIGS. 16-18 show examples of voltage tuning in various types of transistors (unipolar and ambipolar) with the metal nanoparticle monolayer charge trapping layer. Tuning and adaptability of the threshold voltage is critical to open new possibilities for circuit fabrication and higher order functions, such as chemical sensing and energy capture.

FIG. 16 shows an example non-limiting illustration of tuning the threshold voltage according to different sized gold nanoparticles (diameter 15 nm 1602, 20 nm 1606, 25 nm 1610), according to an embodiment. The 15 nm, 20 nm and 25 nm diameters were chosen to avoid the quantum size effects that become pronounced in metal nanoparticles below 10 nm. To ensure that the gold nanoparticles are metallic without gold oxide, a citrate-reduction method was performed.

Substrates were subsequently immersed in a solution of 3-aminopropytriethoxysilane (12.5 μl of APTES in 10 ml toluene) for 45 min at room temperature under nitrogen atmosphere. Excess, nonreacted aminopropytriethoxysilane molecules were removed by rinsing in toluene for three times and dried under nitrogen gas.

Finally, the functionalized substrates were dipped into 15 nm, 20 nm and 25 nm metal colloidal solutions respectively for 12 hours to form the metal nanoparticle monolayer. In the programming/erasing operation, reversible Vth shifts and reliable memory performances has been observed at 1604, 1608 and 1612. A strong size-dependent effect on Vth shifts and memory effect was observed. Effect of size dependence on the mobilities (μ), on/off current ratios, subthreshold swings (S), data retention characteristics (>$10^5$ s) and endurance performances operation (>800 cycles) of memory devices has been observed. The results suggest a guideline for optimizing the size and density of the metal nanoparticles and their influence on the device properties.

FIG. 17 is an example non-limiting illustration 1700 of tuning the electron/hole mobility in an ambipolar transistor by inserting a monolayer of metal nanoparticles, according to an embodiment.

Different organic materials were utilized as p-channel and n-channel materials for the organic heterojunction transistors. In organic heterojunction transistors, the charge accumulation and transport of charge carriers (holes and electrons) usually occur in different layers. Exploring an active and simple mechanism to balance the charge transport is necessary for the application in wide variety of device architectures.

A self-assembled monolayer of metal nanoparticles was inserted between the gate dielectric and the active layer. With the control over the gate bias, electron and hole currents are adjusted to overcome the intrinsic material limitations. The ambipolar behavior has been actively tuned by the insertion of monolayer of gold nanoparticles in the device architecture.

FIG. 18 shows an example non-limiting comparison of transfer characteristics when a graphene oxide layer is included over the metal nanoparticle layer 1804 compared to the metal nanoparticle layer alone 1802.

At 1802, a scanning electron microscope image of self-assembled 15 nm gold nanoparticle monolayer is shown. At 1804, a tapping mode atomic force microscope image of a reduced graphine oxide sheet aligned on the gold nanoparticle monolaye is shown. Transfer characteristics of a single floating gate memory device 1806 and a dual floating gate memory device 1808 at initial state, programmed state and erased state.

What has been described above includes examples of the embodiments of the subject disclosure. It is, of course, not possible to describe every conceivable combination of components or methods for purposes of describing the claimed subject matter, but it is to be appreciated that many further combinations and permutations of the various embodiments are possible. Accordingly, the claimed subject matter is intended to embrace all such alterations, modifications, and variations that fall within the spirit and scope of the appended claims. While specific embodiments and examples are described in this disclosure for illustrative purposes, various modifications are possible that are considered within the scope of such embodiments and examples, as those skilled in the relevant art can recognize.

In addition, the words "example" or "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

In addition, while an aspect may have been disclosed with respect to only one of several embodiments, such feature may be combined with one or more other features of the other embodiments as may be desired and advantageous for any given or particular application. Furthermore, to the extent that the terms "includes," "including," "has," "contains," variants thereof, and other similar words are used in either the detailed description or the claims, these terms are intended to be inclusive in a manner similar to the term "comprising" as an open transition word without precluding any additional or other elements. \Numerical data, such as temperatures, concentrations, times, ratios, and the like, are presented herein in a range format. The range format is used merely for convenience and brevity. The range format is meant to be interpreted flexibly to include not only the numerical values explicitly recited as the limits of the range, but also to include all the individual numerical values or sub-ranges encompassed within the range as if each numerical value and sub-range is explicitly recited. When reported herein, any numerical values are meant to implicitly include the term "about." Values resulting from experimental error that can occur when taking measurements are meant to be included in the numerical values.

What is claimed is:

1. A device, comprising:

a first charge trapping layer that stores an electric charge associated with a voltage applied to the first charge trapping layer comprising a monolayer array of metal nanoparticles, wherein the monolayer array of metal nanoparticles is self assembled with an ultra high density, wherein metal nanoparticles of the monolayer array of metal nanoparticles comprise a diameter greater than 10 nm, and wherein an average distance between any two of the metal nanoparticles is less than or equal to about 3 nanometers;

a substrate layer at least partially coated with the first charge trapping layer, wherein the first charge trapping layer and the substrate layer are configured to change a magnitude of the voltage applied to the device based on an increase or a decrease of the diameter of metal nanoparticles of the monolayer array of metal nanoparticles or an increase or decrease of the average distance between any two of the metal nanoparticles;

a second charge trapping layer comprising a two-dimensional reduced graphene oxide sheet comprising a thickness of at most 1 nm that partially covers the first charge trapping layer, wherein an energy barrier between the first charge trapping layer and the second charge trapping layer inhibits leakage of the electric charge from within the device; and a control component that enables a tuning of a voltage shift threshold between the first charge trapping layer and the substrate layer based on an increase in the diameter of the metal nanoparticles, wherein the tuning enables the device to comprise a first capability to perform greater than 800 cycles of a programming and erasing operation, and a second capability to retain a set of data for greater than $10^5$ seconds.

2. The device of claim 1, wherein the metal nanoparticles of the monolayer array of metal nanoparticles comprise a metal material or the metal covered by a metal shell, wherein the metal comprises a silver, a platinum, a copper, or a gold material, and wherein the metal shell comprises the silver, the platinum, the copper, or the gold material.

3. The device of claim 1, wherein the second charge trapping layer covers at least twenty five percent of the first charge trapping layer.

4. The device of claim 1, wherein the increase or the decrease in the average distance between any two of the metal nanoparticles respectively increases or decreases a capacity to store the electric charge.

5. The device of claim 1, wherein the metal nanoparticles are coated with a surfactant.

6. The device of claim 5, wherein the surfactant comprises alkanethiol with an aliphatic chain.

7. The device of claim 1, wherein the substrate layer is composed of a polymer.

8. A method, comprising:

synthesizing metal nanoparticles with diameters greater than 10 nm in a colloidal solution;

dipping a substrate in the colloidal solution to facilitate a self-assembly of a monolayer of metal nanoparticles on the substrate;

printing the monolayer of metal nanoparticles onto the substrate via a micro-contact printing technique;

partially covering the monolayer of metal nanoparticles with a two-dimensional reduced graphene oxide sheet, wherein an energy barrier between the monolayer of metal nanoparticles and the two-dimensional reduced graphene oxide sheet comprising a thickness of at most 1 nm inhibits leakage of an electric charge from within the device;

storing, at the monolayer of metal nanoparticles, an electric charge associated with a voltage applied to the monolayer of metal nanoparticles, wherein the monolayer of metal nanoparticles are self assembled with an ultra high density, and wherein an average distance between any two metal nanoparticles of the monolayer of metal nanoparticles is less than or equal to about 3 nanometers; and controlling a capacitance of multilevel data storage by a device comprising the monolayer of metal nanoparticles printed onto the substrate, a voltage shift threshold between the monolayer of metal nanoparticles and the substrate, an endurance performance capability of the device, and a data retention capability of the device, wherein the endurance performance capability is a capability of performing greater than 800 cycles of a programming and erasing operation by the device, and wherein the data retention capability of the device is a capability to retain a set of data by the device for greater than $10^5$ seconds.

9. The method of claim 8, further comprising functionalizing the substrate before the self-assembly of the monolayer of metal nanoparticles.

10. The method of claim 8, further comprising applying citrate-reduction to the metal nanoparticles of the monolayer of metal nanoparticles to remove metal oxide of the metal nanoparticles.

11. The method of claim 8, wherein the sheet of two dimensional reduced graphene oxide partially covers at least twenty five percent of the monolayer of metal nanoparticles.

12. The method of claim 8, wherein the monolayer of metal nanoparticles is a first charge trapping layer of a device and the sheet of two dimensional reduced graphene oxide is a second charge trapping layer of the device, and wherein the first charge trapping layer and the second charge trapping layer store the electric charge associated with the voltage applied to the monolayer of metal nanoparticles.

* * * * *